(12) United States Patent
Limmer et al.

(10) Patent No.: US 6,268,758 B1
(45) Date of Patent: Jul. 31, 2001

(54) CIRCUIT ARRANGEMENT WITH HALF-BRIDGE

(75) Inventors: Walter Limmer, Munich; Andreas Huber, Maisach; Peter Niedermeier, Munich, all of (DE)

(73) Assignee: Patent-Treuhand-Gesellschaft fuer elektrische Gluehlampen mbH, Munich (DE)

( * ) Notice: Subject to any disclaimer, the term of this patent is extended or adjusted under 35 U.S.C. 154(b) by 0 days.

(21) Appl. No.: 09/542,339

(22) Filed: Apr. 5, 2000

(30) Foreign Application Priority Data

Apr. 16, 1999 (DE) ............................................... 199 17 364

(51) Int. Cl.$^7$ .................................................. H03K 17/56
(52) U.S. Cl. ........................................ 327/424; 327/110
(58) Field of Search .................................... 327/108, 109, 327/110, 111, 112, 423, 424, 588

(56) References Cited

U.S. PATENT DOCUMENTS 3,770,986 * 11/1973 Drehle .................................. 307/270
5,994,929 * 11/1999 Sano et al. .......................... 327/111

* cited by examiner

Primary Examiner—Jeffrey Zweizig
(74) Attorney, Agent, or Firm—Carlo S. Bessone

(57) ABSTRACT

The invention relates to a circuit arrangement having a half-bridge arrangement comprising a first and a second switch (T1;T2), each switch (T1;T2) having, between its operating and reference electrodes, an internal diode (DB1;DB2), which is reverse-connected in parallel with the main current flow direction of the respective switch (T1;T2), and also an internal capacitance ($C_{OSS}1;C_{OSS}2$), a series diode (DS1;DS2) being arranged in series with the respective switch (T1;T2) in the main current flow direction in such a way that current can flow in the main current flow direction, and a freewheeling diode (DF1;DF2) being connected in parallel with the respective series circuit formed by the switch (T1;T2) and the series diode (DS1;DS2), and having a load circuit (L;RL), which has at least one inductive component (L) and is connected to the midpoint of the half-bridge arrangement. In order to reduce the failure rate of the series diodes (DS1;DS2), a load-relieving capacitance (CE1;CE2) is connected in parallel with each series diode (PS1;DS2).

10 Claims, 4 Drawing Sheets

CIRCUIT ARRANGEMENT WITH HALF-BRIDGE

The present invention relates to a circuit arrangement having a half-bridge arrangement comprising a first and a second switch, each switch having, between its operating and reference electrodes, an internal diode, which is reverse-connected in parallel with the main current flow direction of the respective switch, and also an internal capacitance, a series diode being arranged in series with the respective switch in the main current flow direction in such a way that current can flow in the main current flow direction, and a freewheeling diode being connected in parallel with the respective series circuit formed by the switch and the series diode, and having a load circuit, which has at least one inductive component and is connected to the midpoint of the half-bridge arrangement.

Such a circuit arrangement, disclosed in the prior art, is illustrated in FIG. 1. It will be used to illustrate the problem on which the invention is based.

FIG. 1 shows the part which is of interest, in the context of the present invention, of a circuit arrangement which can be found in a wide variety of fields appertaining to electronics, for example in step-down controllers, DC motor power converters and three-phase motor power converters, etc. It comprises a half-bridge arrangement with two switches T1 and T2, in this instance MOSFET transistors, which are fed from a DC voltage source $U_G$, for example an intermediate circuit voltage. In order to comprehend the considerations which lead to the circuit illustrated in FIG. 1, the circuit illustrated in FIG. 1 will first be considered without the series diodes DS1 and DS2 arranged in series with the switches T1 and T2, and the freewheeling diodes DF1 and DF2 connected in parallel with the respective combination formed by series diode and switch. A load circuit is connected to the midpoint of the half-bridge, said load circuit having an inductive component, schematically illustrated as a series circuit formed by an inductance L and a non-reactive resistance RL, through both of which the load current $I_L$ flows. The load circuit is furthermore connected to the midpoint of two series-connected capacitors C1, C2, which are arranged in parallel with the half-bridge switches T1 and T2. The half-bridge switches T1 and T2 are driven by a control device S, illustrated schematically. FIG. 2 shows an equivalent circuit diagram of a MOSFET, revealing that the drain and source have arranged between them a so-called body diode DB, which is reverse-connected in parallel with the main current flow direction from the drain to the source, and an output capacitance $C_{OSS}$ in parallel with said diode. FIG. 3 shows the time characteristic of the load current $I_L$ for exemplary driving of the half-bridge arrangement by the control device S. During phase 1, the transistor T2 is switched off and the transistor T1 is alternately switched on and off, whereas this is reversed in phase 2. During the phase section 1a, which is shown enlarged, the current flows in the mesh—$U_G$ T1 L RL C2, and, during the phase section 1b, the load current flows further in the mesh L RL C2 T2 after T1 has been switched off, T2 remaining switched off, on account of the inductive component of the load circuit. This is made possible by the body diode DB of the switch T2. With regard to its electric properties, the body diode DB inherent to the transistor T2 is characterized by a very slow turn-off time and a low forward voltage. If T1 is then switched on again after phase 1b, in other words the voltage $U_\mu$ equal to $U_G$ is present at the midpoint of the half-bridge, then a current flows briefly via the body diode DB of the transistor T2, which current could be referred to as a short-circuit current, which leads to a high power loss converted in the transistor. This leads to internal and external interference with such a circuit arrangement, for example in the EMC range.

In order to improve the reliability of such a circuit and in order to avoid the necessity of shields for suppressing interference, the prior art has provided for arranging a series diode DS1 or DS2, respectively, in series with each switch, said diodes preferably being realized as Schottky diodes since these diodes typically have a low forward voltage, and which diodes are oriented in such a way as to enable current to flow in the main current flow direction of the respective switch. As a consequence, therefore, the respective series diode DS1 or DS2, respectively, and the associated body diode DB1 or DB2, respectively, (also see FIG. 4 in this respect) are reverse-connected in series, which is why current is prevented from flowing through the respective body diode during the freewheeling process (phase 1B of FIG. 3). Since the function of the body diode inherent to the MOSFET is accordingly prevented by the respective series diode, it is necessary to provide a freewheeling diode DF1 or DF2, respectively, which is arranged in parallel with said combination and now undertakes the original function of the respective body diode.

In practice, however, it has now been shown that, in the case of a circuit arrangement of this type, one of the two diodes DS1 or DS2 frequently fails.

The object of the present invention, therefore, is to improve a circuit arrangement of the type mentioned in the introduction, as is illustrated in FIG. 1, in such a way that the failure rate of the series diodes DS1 and/or DS2 is reduced.

This object is achieved by virtue of the fact that a load-relieving capacitance is connected in parallel with each series diode. This measure, the function of which is explained in detail further below, leads not only to a significantly reduced failure rate of the diodes DS1 and/or DS2, but also to a reduction in the power loss converted in the circuit. It also enables the use of smaller and thus less expensive diodes for the series diodes DS1 and DS2.

The solution according to the invention can preferably be applied to half-bridge arrangements whose switches are realized by a MOSFET, in which case, as mentioned, the respective internal diode is formed by the respective body diode and the respective internal capacitance is formed by the respective output capacitance $C_{OSS}$. This fact notwithstanding, the solution according to the invention can also be used in circuit arrangements in which these components, which are parasitic components of a MOSFET, are engendered by a different combination.

Each load-relieving capacitance is preferably dimensioned in such a way that the voltage dropped during operation of the circuit arrangement across the load-relieving capacitance of the respective voltage divider essentially formed from the load-relieving capacitance and the internal capacitance is always smaller than the reverse voltage of the respective series diode. The load-relieving capacitance is preferably 100 pF to 10 nF.

It goes without saying that the application of the invention is not limited to half-bridge arrangements, but rather can be realized with the use of two further switches in a full-bridge arrangement, the load circuit being coupled between the midpoints of the switches.

The solution according to the invention can also be realized, with the half-bridge arrangement being supplemented by four further switches, in a three-phase bridge to which the load circuit is coupled. In this respect, diverse areas of use emerge, mention being made, by way of example, of step-down controllers, as are used in ballasts for operating discharge lamps, DC motor power converters and three-phase motor power converters.

Further advantageous developments of the invention are defined in the subclaims.

An exemplary embodiment is described in more detail below with reference to the accompanying drawings, in which.

Figure 1:
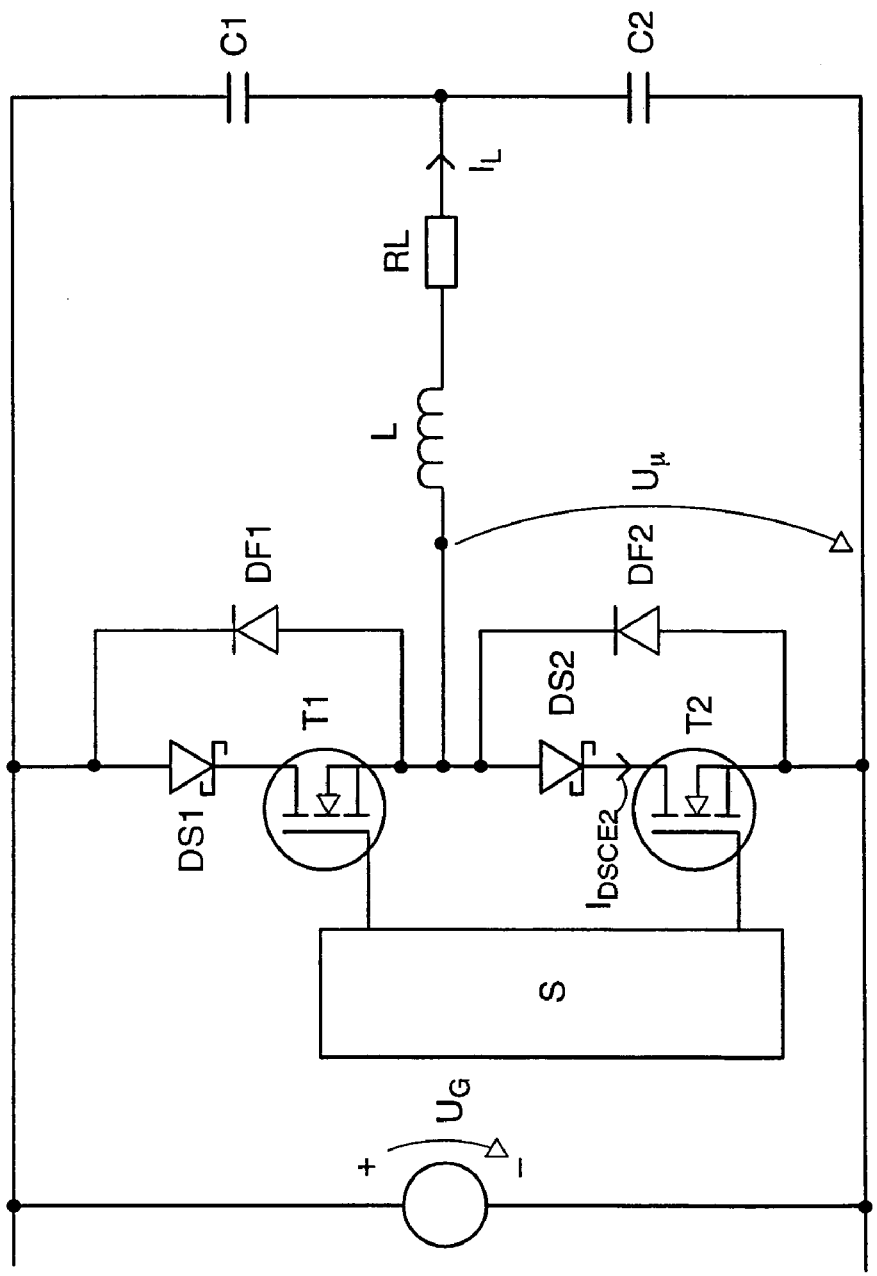
FIG. 1 illustrates a circuit arrangement disclosed in the prior art.
Figure 2:
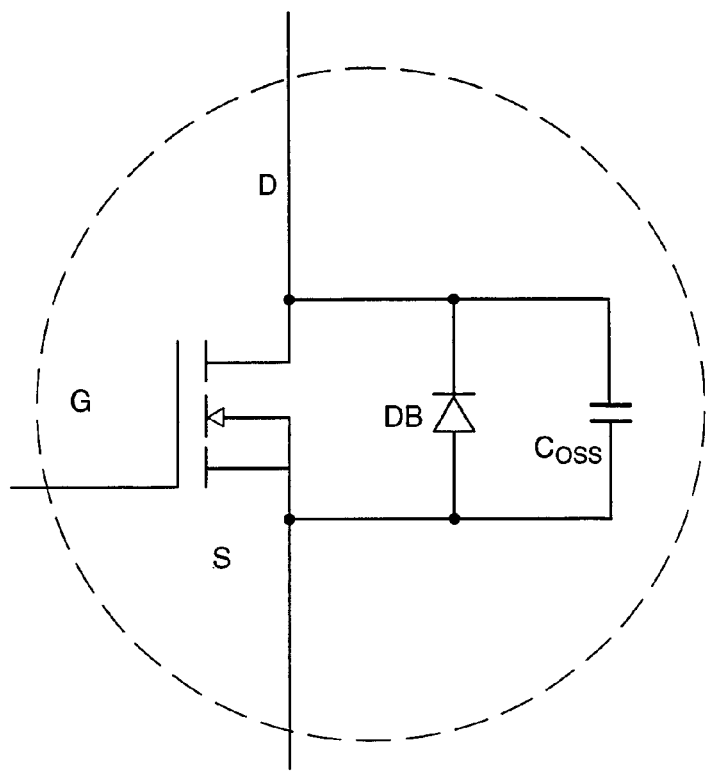
FIG. 2 illustrates an equivalent circuit diagram for a MOSFET.
Figure 3:
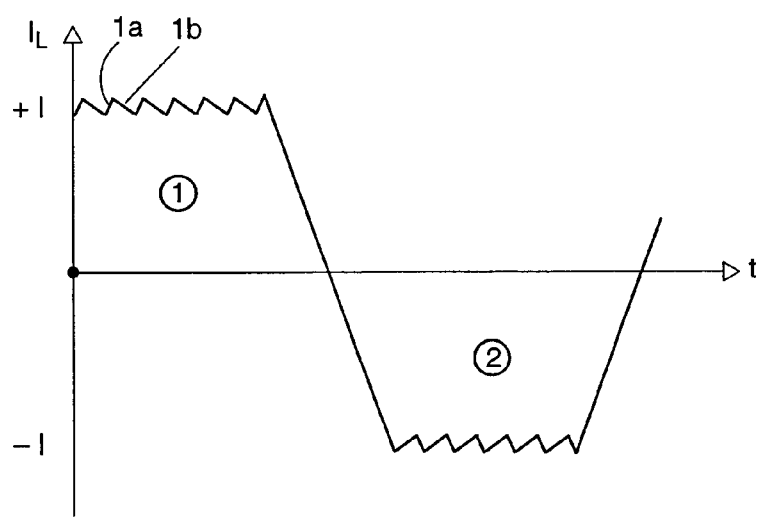
FIG. 3 illustrates the time sequence of the load current $I_L$ in the event of corresponding driving of the circuit arrangement in accordance with FIG. 1.
Figure 4:
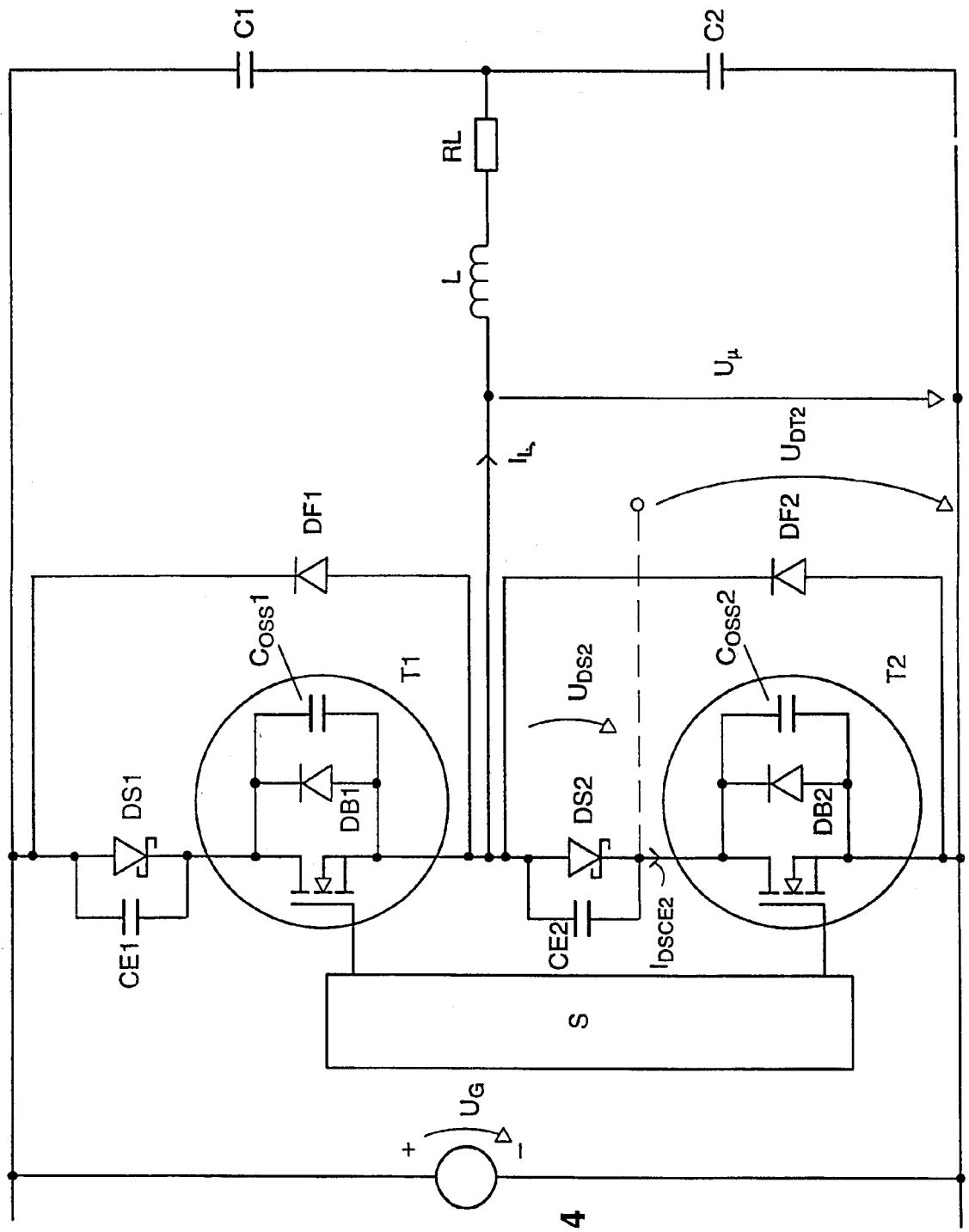
FIG. 4 illustrates a circuit arrangement in which the solution according to the invention is realized.

FIG. 4 shows a circuit arrangement according to the invention, in which the same structural elements as in FIG. 1 and in the equivalent circuit diagram in accordance with FIG. 2 are designated by the same reference symbols. Load-relieving capacitances CE1 and CE2 are connected in parallel with the series diodes DS1 and DS2; said load-relieving capacitances will be disregarded in the first instance for the considerations below. On account of the switching of the transistors T1 and/or T2 and the inductive part of the load circuit, the potential $U_\mu$ of the half-bridge midpoint alternates between $+U_G$ and ground. In this case, the respective drain terminal of the transistors T1 and T2 acts as the operating electrode and the respective source terminal as the reference electrode.

Figure 5:
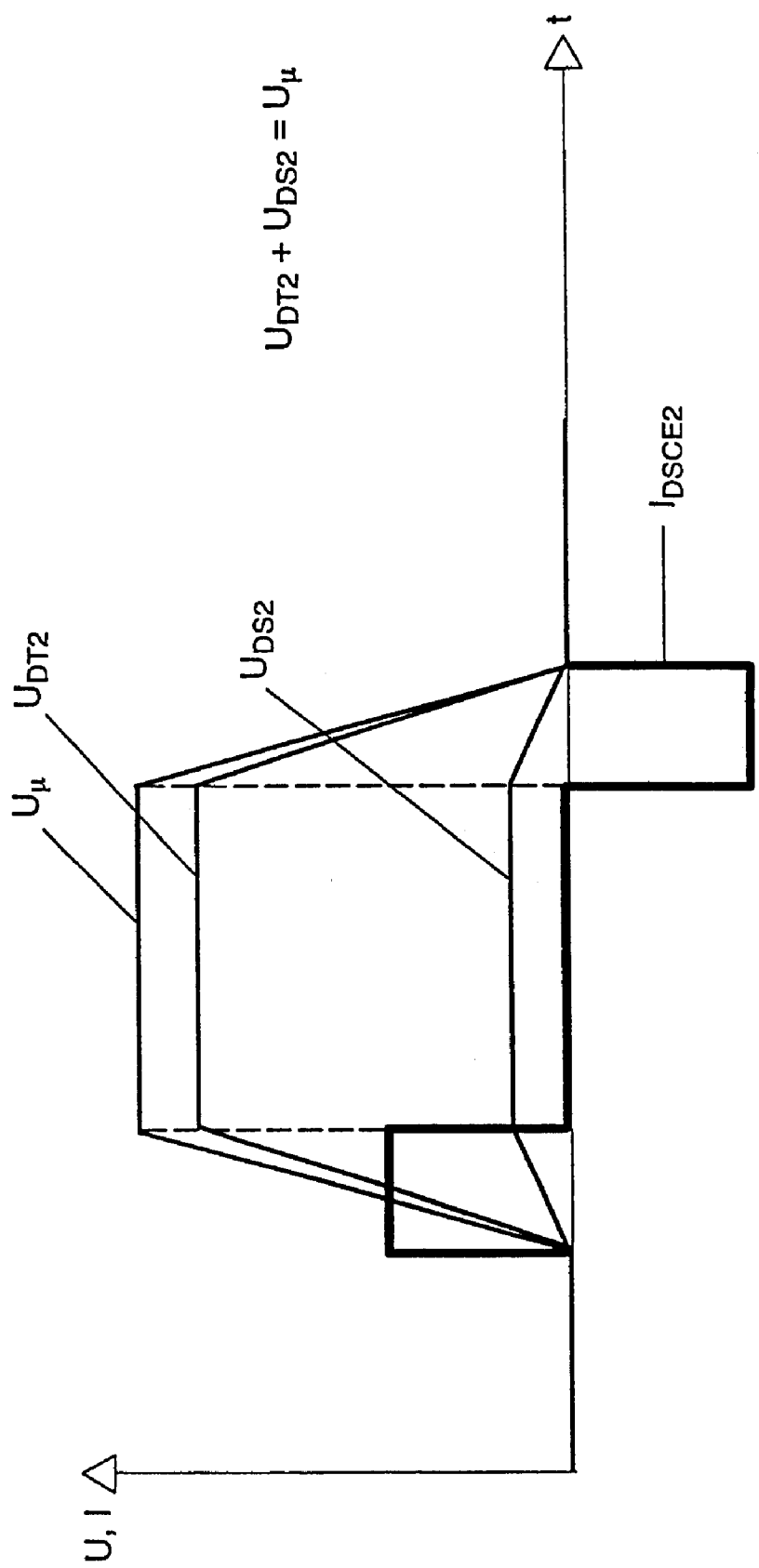
FIG. 5 illustrates time characteristics of the voltages $U_\mu$, $U_{DT2}$, $U_{DS2}$ and of the current $I_{DSCE2}$ of the circuit arrangements in accordance with FIGS. 1 and 4 in the event of corresponding driving.

The steep switching edges during the transition of the potential $U_\mu$ from 0 to $U_G$ lead to a compensating current $I_{DSCE2}$ and to the charging of the capacitance $C_{OSS}2$. The current $I_{DSCE2}$ flows only through the Schottky diode DS2 in the case of FIG. 1, but through the parallel circuit formed by the diode DS2 and the load-relieving capacitance CE2 in the case of FIG. 4. Since $U_\mu$ may be of the order of magnitude of a few hundred volts, or indeed even more than that, a considerable current $I_{DSCE2}$ flows in this case, see FIG. 5. More problematic, however, is the transition from a state in which $U_\mu$ is equal to $U_G$, to $U_\mu$ equal to 0. In this case, a negative $I_{DSCE2}$ flows for the discharge of the output capacitance $C_{OSS}2$, that is to say, in the case of FIG. 1, the diode DS2 is operated in the so-called avalanche mode. Avalanche mode means that a voltage is applied to the diode DS2 in the reverse direction which is larger than the reverse voltage of said diode, for which reason the diode DS2 permits a current flow in the reverse direction (negative $I_{DSCE2}$, see FIG. 5). In the avalanche mode, the diode's own reverse voltage is dropped across it.

The avalanche mode appears to be the primary cause of the failure of the series diodes. In addition, however, this operating mode of the series diodes also leads to the conversion of a power loss in these diodes, namely the product of reverse voltage of DS2 times current $I_{DSCE2}$.

The load-relieving capacitors CE1 and CE2, respectively, which are inserted in accordance with the invention act in the following manner: a negative current $I_{DSCE2}$ charges the load-relieving capacitor CE2, connected in parallel with the series diode DS2, with a defined edge steepness. If the capacitor CE2 is dimensioned in a suitable manner, then it prevents the breakdown voltage of the diode DS2 from being reached. An avalanche mode of the series diode DS2 does not take place, therefore. During the subsequent jump in voltage of $U_\mu$ from ground to $+U_G$, the load-relieving capacitor CE2 is discharged again.

The above explanations apply analogously to the series diode DS1 and the load-relieving capacitor CE1.

For the dimensioning of the respective load-relieving capacitance CE, the respective combination of series diode DS, load-relieving capacitor CE, body diode DB and output capacitance $C_{OSS}$ can be simplified to give a series circuit formed by load-relieving capacitor CE and output capacitance $C_{OSS}$, since both diodes are in the turned-off state. The voltage divider comprising load-relieving capacitor CE and output capacitance $C_{oss}$ is then advantageously dimensioned in such a way that the maximum voltage dropped across the load-relieving capacitor CE remains below the reverse voltage of the series diode DS connected in parallel with the load-relieving capacitor CE. The voltage dependence of the output capacitance $C_{OSS}$ must be taken into consideration in this case.

In addition to the intended effect, namely the reduction in the failure rate of the series diodes, this measure also has the consequence that active power is now no longer converted in the series diodes, rather only reactive volt-amperes are shifted back and forth between load-relieving capacitor and output capacitance $C_{OSS}$. This leads to a reduction in the evolution of heat by the circuit arrangement, with the associated advantages.

The present circuit has been described using the example of a half-bridge arrangement with an n-channel MOSFET, but, as is obvious to a person skilled in the art, it can also be realized using a p-channel MOSFET. Said circuit can readily be used in a full-bridge arrangement if the capacitors C1 and C2 are replaced by switches. As is discernible to a person skilled in the art, said circuit can also be applied to a three-phase motor power converter, in which case preferably four further switches are added to the half-bridge arrangement.

It is irrelevant to the method of operation of the invention whether the combination formed by the series diode DS and the load-relieving capacitance CE is connected to the associated switch on the operating electrode side or the reference electrode side.

What is claimed is:
1. A circuit arrangement having
   a half-bridge arrangement comprising a first and a second switch (T1;T2), each switch (T1;T2) having, between its operating and reference electrodes, an internal diode (DB1;DB2), which is reverse-connected in parallel with the main current flow direction of the respective switch (T1;T2), and also an internal capacitance ($C_{OSS}1;C_{OSS}2$) a series diode (DS1;DS2) being arranged in series with the respective switch (T1;T2) in the main current flow direction in such a way that current can flow in the main current flow direction, and a freewheeling diode (DF1;DF2) being connected in parallel with the respective series circuit formed by the switch (T1;T2) and the series diode (DS1;DS2), and
   a load circuit (L;RL), which has at least one inductive component (L) and is connected to the midpoint of the half-bridge arrangement,
wherein a load-relieving capacitance (CE1;CE2) is connected in parallel with each series diode (DS1;DS2).

2. The circuit arrangement as claimed in claim 1, wherein the first and second switches (T1;T2) of the half-bridge arrangement are realized by a MOSFET, the respective internal diode being formed by the respective body diode (DB1;DB2) and the respective internal capacitance being formed by the respective output capacitance ($C_{OSS}1;C_{OSS}2$).

3. The circuit arrangement as claimed in claim 1, wherein each load-relieving capacitance (CE1;CE2) is dimensioned in such a way that the voltage dropped during operation of the circuit arrangement across the load-relieving capacitance (CE1;CE2) of the respective voltage divider essentially formed from the load-relieving capacitance (CE1;CE2) and the internal capacitance ($C_{OSS}1;C_{OSS}2$) is always smaller than the reverse voltage of the respective series diode (DS1;DS2).

4. The circuit arrangement as claimed in claim 3, wherein the load-relieving capacitance (CE1;CE2) is between 100 pF and 10 nF.

5. The circuit arrangement as claimed in claim 1, wherein the half-bridge arrangement and two further switches form a full-bridge arrangement between whose midpoints the load circuit (L;RL) is coupled.

6. The circuit arrangement as claimed in claim 1, wherein the half-bridge arrangement and four further switches form a three-phase bridge to which the load is coupled.

7. A step-down controller having a circuit arrangement as claimed in claim 1.

8. A DC motor power converter having a circuit arrangement as claimed in claim 1.

9. A three-phase motor power converter having a circuit arrangement as claimed in claim 1.

10. A ballast for operating discharge lamps having a step-down controller as claimed in claim 7.

* * * * *